United States Patent [19]

Altman et al.

[11] Patent Number: 4,948,941
[45] Date of Patent: Aug. 14, 1990

[54] METHOD OF LASER DRILLING A SUBSTRATE

[75] Inventors: Leonard F. Altman, Coral Springs; Thomas N. Johnson, Davie, both of Fla.

[73] Assignee: Motorola, Inc., Schaumburg, Ill.

[21] Appl. No.: 316,060

[22] Filed: Feb. 27, 1989

[51] Int. Cl.⁵ .............................................. B23K 26/00
[52] U.S. Cl. ............................. 219/121.71; 219/121.85
[58] Field of Search ............. 219/121.7, 121.71, 121.6, 219/121.85

[56] References Cited

U.S. PATENT DOCUMENTS 3,956,052  5/1976  Koste et al. ................ 219/121.71 X

FOREIGN PATENT DOCUMENTS

| | | | |
|---|---|---|---|
| 14484 | 1/1982 | Japan | 219/121.71 |
| 33091 | 2/1984 | Japan | 219/121.71 |
| 74791 | 4/1986 | Japan | 219/121.71 |
| 229492 | 10/1986 | Japan | 219/121.71 |
| 93091 | 4/1987 | Japan | 219/121.71 |

Primary Examiner—C. L. Albritton
Attorney, Agent, or Firm—Michael J. Buchenhorner

[57] ABSTRACT

A method of laser drilling a substrate includes the steps of placing a sacrificial member over the substrate, and then laser drilling through the sacrificial member. This method produces a substantially uniform hole in the substrate.

5 Claims, 2 Drawing Sheets

METHOD OF LASER DRILLING A SUBSTRATE

BACKGROUND OF THE INVENTION

The present invention relates to laser drilling in general, and particularly to laser drilling holes in refractory materials, such as alumina and ceramic. A focused or coherent energy source such as a laser beam is often used to cut precision patterns or drill holes in refractory materials. The process of cutting these types of materials is not one of mechanically abrading material, but heating the material with the laser beam and vaporizing it. The vaporized material is spewed out of the hole or kerf, and sometimes redeposits on the surrounding cooler surfaces.

The process of vaporizing is not a uniform one, resulting in holes that are wide at the top and taper down to a narrower size at a distance into the material. This is shown in FIGS. 1 and 2 which illustrate a substrate 10 having laser drilled holes 11. The larger diameter openings 12 appear at the top of the substrate 10. The diameter tapers to the more uniform diameter of the holes 11 at a distance from the top surface (i.e. the side to which the laser beam was applied). For example, for a ceramic substrate 10 having a thickness of 0.025 inches it may be desired to provide holes 11 having a diameter of 0.005 inches, spaced 0.010 inches center to center. The openings 12 can be from 0.003 to 0.005 inches greater than the desired hole diameter. This area of greater diameter can extend for a depth of 0.005 to 0.008 inches before tapering to the desired diameter.

When drilling holes that are closely spaced, this taper effect is particularly, undesirable, in that the edges of the enlarged holes can touch or overlap. Cutting precision patterns is also hampered by this phenomenon, severely restricting the potential use of lasers in creating precision patterns.

SUMMARY OF THE INVENTION

This method of laser drilling a substrate produces substantially uniform diameter holes even at the top surface of the substrate.

The method of laser drilling a substrate includes the steps of placing a first or sacrificial member adjacent to the substrate, and forming a hole or cavity in the substrate by penetrating the member and the substrate with a laser beam. In one aspect of the invention, the member has a thickness less than that of the substrate. In another aspect of the invention, the member is composed of the same material as the substrate. In still another aspect of the invention, the substrate is ceramic.

DESCRIPTION OF THE PREFERRED EMBODIMENT

Figure 1:
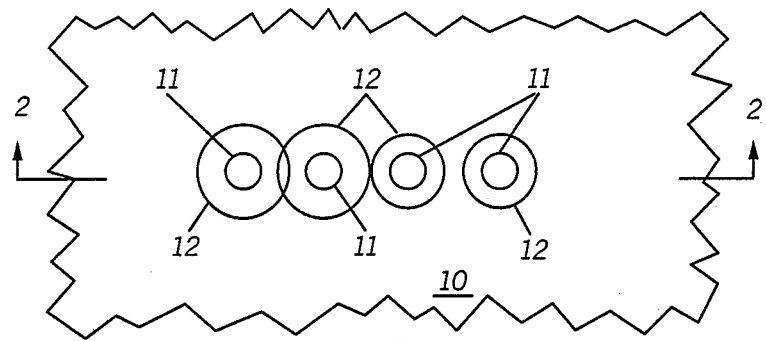
FIG. 1 is a top plan view of a prior art laser drilled substrate.
Figure 2:
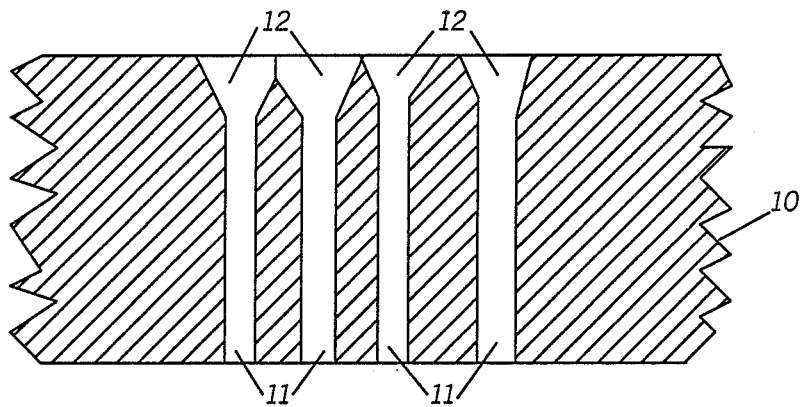
FIG. 2 is a cross-sectional view of the prior art substrate of FIG. 1 taken on line 2—2.
Figure 3:
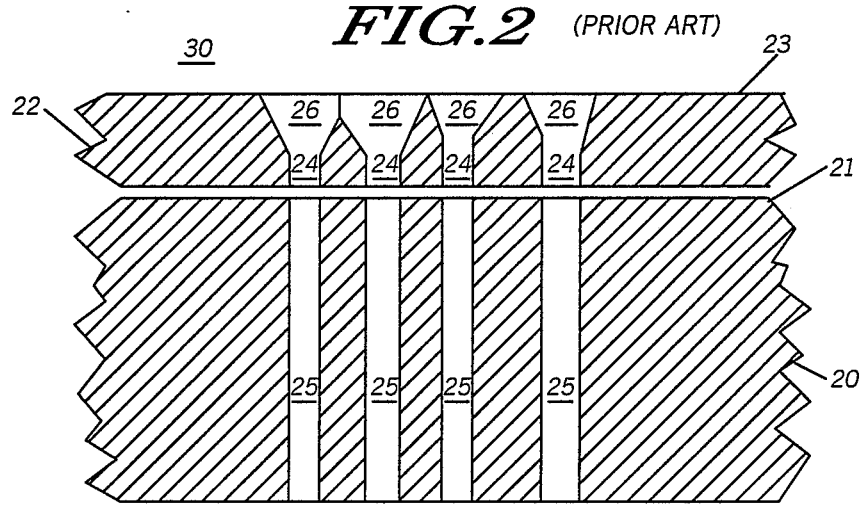
FIG. 3 is a cross sectional view of a substrate and a sacrificial shield in accordance with the present invention.

Referring now by characters of reference to drawing FIG. 3, it will be understood that a substrate 20 of a refractory material such as ceramic is to be laser drilled or cut. The substrate 20 includes an upper surface 21 through which the laser beam will enter the substrate. A sacrificial substrate or member 22 is placed over or contiguous to the upper surface 21 of substrate 20. The sacrificial member 22 includes an upper surface 23 to which a laser drilling or cutting beam indicated by arrow 30 is applied. The laser beam 30 will form an opening 24 through sacrificial member 22 including a wider upper casing 26 in the same manner as is discussed relative to the prior art drawings of FIGS. 1 and 2.

By maintaining the sacrificial member 22 in close proximity or contact with the substrate 20, the laser beam 30 will form a substantially uniform hole 25 in the substrate 20 even at its upper surface 21. While FIG. 3 shows a slight space between the substrate 20 and member 22, it will be appreciated that they should be clamped or held in as close contact as possible to minimize any detrimental effects of beam enlargement. The holes 25 while illustrated as through holes can be partial through-holes or cut slots as may be desired in laser cutting or drilling the substrate 20.

Figure 4:
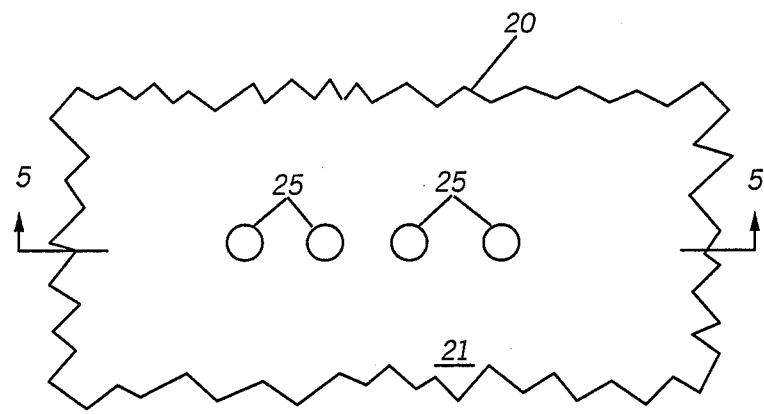
FIG. 4 is a top plan view of the substrate after laser drilling in accordance with the present invention.
Figure 5:
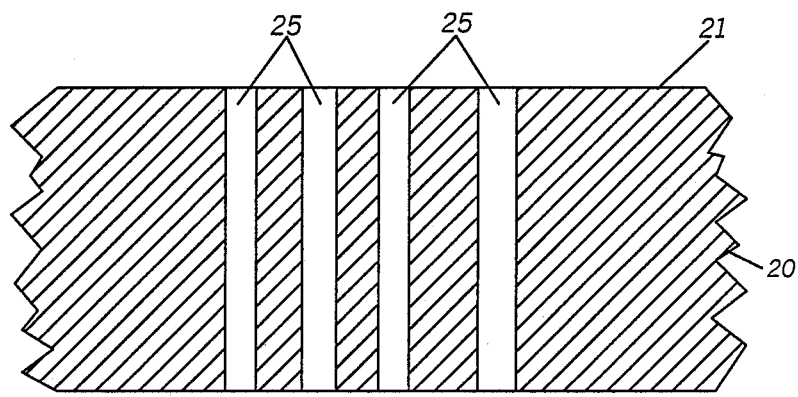
FIG. 5 is a cross-sectional view of the substrate of FIG. 4 taken on line 5—5.

After a completion of the laser drilling the sacrificial member 22 can be removed and discarded having served its purpose of absorbing the initial bursts of high energy. The drilled substrate 20 is illustrated in further detail in FIGS. 4 and 5. The substantially uniform holes 25 provided in the upper surface 21 can be closely spaced without enlarged mouth openings interengaging. This is important where the substrate is to be used for electrical circuitry.

We claim as our invention:

1. A method for forming a hole or cavity in a substrate with a coherent energy beam, comprising the steps of:
   selecting a first member having a thickness less than the substrate and composed of the same material as the substrate;
   placing the first member contiguous to the substrate; and
   forming a hole or cavity in the substrate by penetrating said member and said substrate with the coherent energy beam.

2. A method of laser drilling a substrate comprising the steps of:
   first selecting a sacrificial member having a thickness less than the substrate and composed of the same material as the substrate;
   placing a sacrificial member adjacent to the substrate, and
   laser drilling through both the sacrificial member and the substrate.

3. A method of laser drilling a substrate as defined in claim 2, including the step of:
   selecting a ceramic substrate.

4. A method of laser drilling a ceramic substrate comprising the steps of:
   placing a thin sacrificial ceramic member adjacent to a ceramic substrate,
   laser drilling the sacrificial ceramic member, and
   laser drilling the ceramic substrate through the sacrificial member.

5. A method as defined in claim 4 including the step of fastening the sacrificial member and the ceramic substrate together prior to the steps of laser drilling.

* * * * *